(12) United States Patent
Lin et al.

(10) Patent No.: US 9,818,603 B2
(45) Date of Patent: Nov. 14, 2017

(54) SEMICONDUCTOR DEVICES AND METHODS OF MANUFACTURE THEREOF

(71) Applicant: Taiwan Semiconductor Manufacturing Company, Ltd., Hsin-Chu (TW)

(72) Inventors: Wei-Chi Lin, Zhubei (TW); Chin-Hsiang Lin, Hsin-Chu (TW); Neng-Kuo Chen, Hsin-Chu (TW); Sey-Ping Sun, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 171 days.

(21) Appl. No.: 14/199,595

(22) Filed: Mar. 6, 2014

(65) Prior Publication Data
US 2015/0255581 A1    Sep. 10, 2015

(51) Int. Cl.
| | |
|---|---|
| *H01L 21/02* | (2006.01) |
| *H01L 27/088* | (2006.01) |
| *H01L 21/28* | (2006.01) |
| *H01L 29/51* | (2006.01) |
| *H01L 21/8234* | (2006.01) |
| *H01L 21/84* | (2006.01) |
| *H01L 27/12* | (2006.01) |
| *H01L 29/165* | (2006.01) |

(52) U.S. Cl.
CPC ...... *H01L 21/0234* (2013.01); *H01L 21/0228* (2013.01); *H01L 21/02164* (2013.01); *H01L 21/02274* (2013.01); *H01L 21/02337* (2013.01); *H01L 21/02348* (2013.01); *H01L 21/28185* (2013.01); *H01L 21/28194* (2013.01); *H01L 21/28255* (2013.01); *H01L 21/823412* (2013.01); *H01L 21/823431* (2013.01); *H01L 21/845* (2013.01); *H01L 27/0886* (2013.01); *H01L 27/1211* (2013.01); *H01L 29/513* (2013.01); *H01L 29/517* (2013.01); *H01L 21/823462* (2013.01); *H01L 29/165* (2013.01)

(58) Field of Classification Search
CPC .................. H01L 29/785; H01L 27/10879
See application file for complete search history.

(56) References Cited

U.S. PATENT DOCUMENTS

| | | | | |
|---|---|---|---|---|
| 6,207,561 B1* | 3/2001 | Hwang | ............ | H01L 21/31604 257/E21.008 |
| 6,420,742 B1* | 7/2002 | Ahn | .................. | H01L 21/28291 257/288 |
| 9,105,527 B2* | 8/2015 | Van Duren | ......... | H01L 27/1259 |
| 2013/0112975 A1* | 5/2013 | Choi | ................... | H01L 27/1248 257/59 |
| 2015/0255457 A1* | 9/2015 | Loubet | ................ | H01L 27/0886 257/77 |

* cited by examiner

*Primary Examiner* — Mohammad Choudhry
(74) *Attorney, Agent, or Firm* — Slater Matsil, LLP

(57) ABSTRACT

Semiconductor devices and methods of manufacture thereof are disclosed. In some embodiments, a method of manufacturing a semiconductor device includes providing a substrate, the substrate includes a first fin, a second fin, and an isolation region disposed between the first fin and the second fin. The second fin includes a different material than a material of the substrate. The method includes forming an oxide over the first fin, the second fin, and a top surface of the isolation region at a temperature of about 400 degrees C. or less, and post-treating the oxide at a temperature of about 600 degrees C. or less.

20 Claims, 2 Drawing Sheets

SEMICONDUCTOR DEVICES AND METHODS OF MANUFACTURE THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

Multiple gate field-effect transistors (MuGFETs) are a recent development in semiconductor technology which typically are metal oxide semiconductor FETs (MOSFETs) that incorporate more than one gate into a single device. One type of MuGFET is referred to as a fin-FET (FinFET), which is a transistor structure with a fin-like semiconductor channel that is raised vertically out of the silicon surface of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
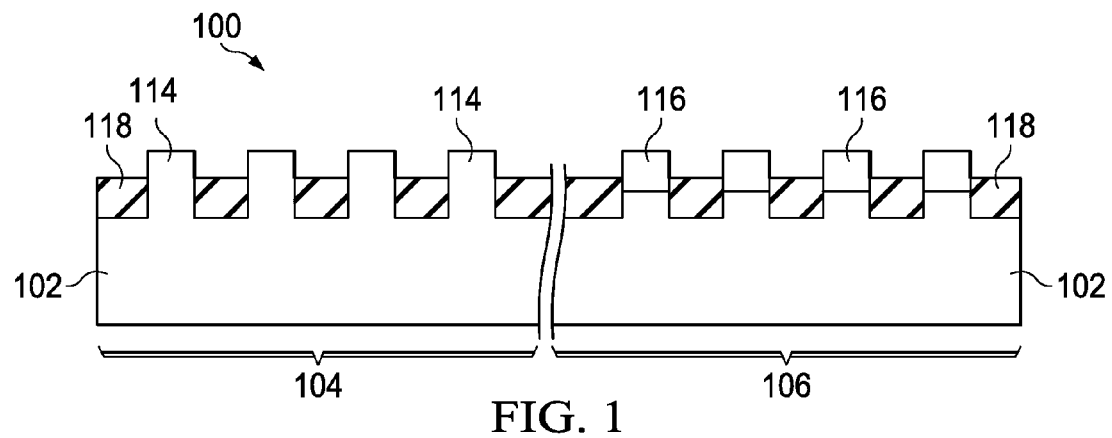
FIGS. 1 through 5 illustrate cross-sectional views of a method of manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure provide novel methods of manufacturing semiconductor devices that include FinFETs and structures thereof. In some embodiments, an oxide is formed over fins of FinFETs of a semiconductor device using a low temperature deposition process. The oxide is post-treated with a low temperature process. The term "post-" is used herein to refer to a treatment or process that is performed on the semiconductor device after the oxide is deposited, for example. An oxide is formed that provides protection for the fins during subsequent processes. The oxide prevents over-consumption of the fin material during the oxide formation process.

FIGS. 1 through 5 illustrate cross-sectional views of a method of manufacturing a semiconductor device 100 at various stages in accordance with some embodiments of the present disclosure. Referring first to FIG. 1, a semiconductor device 100 is shown that includes a substrate 102. To manufacture the semiconductor device 100, the substrate 102 is provided. The substrate 102 is part of a semiconductor wafer in some embodiments; e.g., a plurality of semiconductor devices 100 are fabricated on a semiconductor wafer, and the wafer is later singulated along scribe lines. The substrate 102 may include a semiconductor substrate comprising silicon (Si), germanium (Ge), or other semiconductor materials. The substrate 102 may, or may not be, covered by an insulating layer (not shown), for example. The substrate 102 may include active components or circuits (also not shown). The substrate 102 may comprise silicon oxide over single-crystal silicon, for example. The substrate 102 may include conductive layers or semiconductor elements, e.g., transistors, diodes, etc., formed therein. The substrate 102 may comprise a single-crystalline Si or Ge substrate in some embodiments. The substrate 102 may comprise a bulk substrate or a semiconductor-on-insulator (SOI) substrate, for example. The substrate 102 comprises a semiconductive material in some embodiments, for example. Alternatively, the substrate 102 may comprise other materials.

In some embodiments, the substrate 102 comprises a first fin 114 disposed in a first region 104 of the substrate 102, and a second fin 116 disposed in a second region 106 of the substrate 102. The substrate 102 includes an isolation region 118 disposed between the first fin 114 and the second fin 116. The first fin 114 comprises the same material as a material of the substrate 102 in some embodiments. The first fin 114 may comprise the same semiconductive material of the substrate 102, for example. The second fin 116 comprises a different material than the material of the substrate 102 in some embodiments.

In some embodiments, the substrate 102 comprises a plurality of first fins 114 disposed in the first region 104 of the substrate 102. The substrate 102 also comprises a plurality of second fins 116 disposed in the second region 106 of the substrate 102. The fins 114 and 116 comprise semiconductor fins of FinFET devices, to be described further herein.

The substrate 102 includes a plurality of isolation regions 118 which comprise shallow trench isolation (STI) regions, field oxide regions, or other types of isolation regions in some embodiments, for example. The isolation regions 118 comprise an insulating material such as silicon oxide, silicon nitride, other insulating materials, or combinations or multiple layers thereof, as examples. The isolation regions 118 are disposed between adjacent first fins 114 in the first region 104, between adjacent second fins 116 in the second region 106, and between first fins 114 and second fins 116 in edge regions of the first region 104 and the second region 106, respectively. The isolation regions 118 are also referred to herein, e.g., in some of the claims, as STI regions 118.

The first region 104 comprises an input/output device region of the semiconductor device 100 in some embodiments. The first fins 114 may comprise fins of input/output FinFET devices of the semiconductor device 100, for example. The second region 106 comprises a core device region of the semiconductor device 100 in some embodiments. The second fins 116 may comprise fins of core FinFET devices of the semiconductor device 100, for example.

Only a few fins 114 and 116 and FinFET devices (see FinFET devices 140 and 140' shown in FIG. 5) are shown in each of the drawings; however, a semiconductor device 100 may include dozens, hundreds, or thousands of FinFETs formed across a surface thereon, in some embodiments, for example. A semiconductor device 100 may include a plurality of first regions 104 and second regions 106, as another example.

To reiterate, the first fins 114 comprise the same material as the substrate 102 in some embodiments. For example, the substrate 102 may comprise Si, and the first fins 114 may comprise Si. Alternatively, the substrate 102 and the first fins 114 may comprise other materials. The second fins 116 comprise a different material than the substrate 102 in some embodiments. For example, the substrate 102 may comprise Si, and the second fins 116 may comprise SiGe. The second fins 166 may also comprise SiC or Sn, as another example. Alternatively, the second fins 116 may comprise other materials. In some embodiments, the second fins 116 comprise a compound semiconductor material or Sn.

The fins 114 and 116 may be formed using a subtractive etch process, by patterning a substrate 102 with the pattern of the fins 114 and 116, and masking the first fins 114 while a substance is introduced to alter the material of the second fins 116 to comprise a compound semiconductor material or other material different from the substrate 102 material. The second fins 116 may be altered to include the material different than the substrate 102 material using an epitaxial growth process, implantation process, deposition process, or other type of process. The isolation regions 118 are then formed between the fins 114 and 116, by depositing insulating material over and between the fins 114 and 116, and removing any excess insulating material from over top surfaces and top regions of sidewalls of the fins 114 and 116 using a chemical-mechanical polishing (CMP) process and/or an etch process, as examples.

In other embodiments, the isolation regions 118 are formed over the substrate 102, and the isolation regions 118 are patterned with a pattern for the fins 114 and 116. The fins 114 and/or 116 are then epitaxially grown within the patterns formed within the isolation regions 118. Two separate processes may be used to form the first fins 114 and the second fins 116, so that they comprise different materials, depending on the desired functionality of the fins 114 and 116 for the particular type of FinFET devices they will be used in, for example. The first region 104 may be masked during epitaxial growth of the second fins 116, and likewise, the second region 106 may be masked during epitaxial growth of the first fins 114.

Combinations of subtractive etch processes and epitaxial growth processes may also be used to form the fins 114 and 116. The first fins 114 may be formed using a subtractive etch process, and at least a portion of the second fins 116 may be formed using an epitaxial growth process, for example. The isolation regions 118 may be recessed before or after the formation of the fins 114 and 116 so that top surfaces of the isolation regions 118 are recessed below top surfaces of the first fins 114 and the second fins 116, as shown in FIG. 1.

The fins 114 and 116 may comprise a width of about 10 nm to about 100 nm in some embodiments. The fins 114 and 116 may comprise a width of about 150 nm or less, for example. The fins 114 and 116 may also be spaced apart from adjacent fins 114 and/or 116 by a distance of about 10 nm to about 100 nm, for example. The fins 114 and 116 may be spaced apart from adjacent fins 114 and/or 116 by a distance of about 150 nm, for example. Alternatively, the fins 114 and 116 may comprise other dimensions and may be spaced apart by other dimensions.

Figure 2:
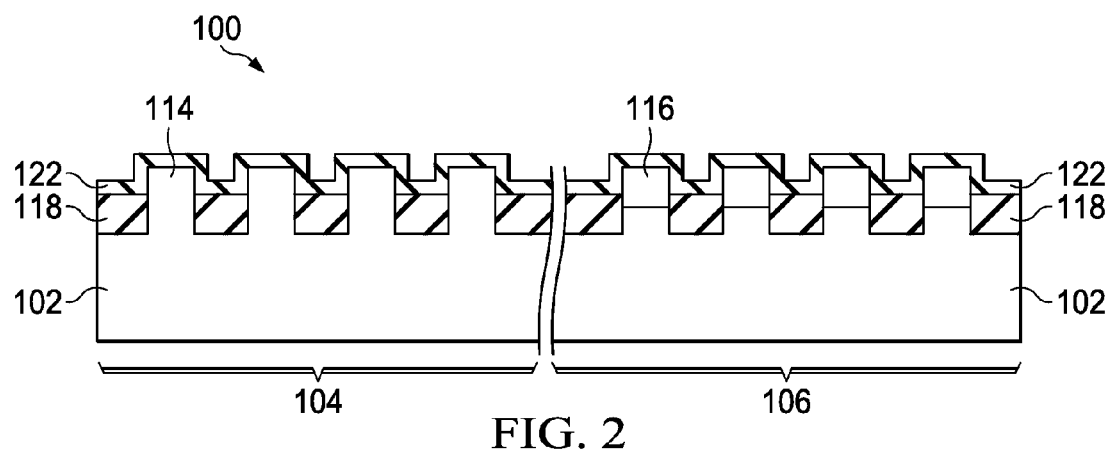

In accordance with some embodiments of the present disclosure, an oxide 122 is then formed over the first fins 114, the second fins 116, and the top surfaces of the isolation regions 118, as shown in FIG. 2 in a cross-sectional view. The oxide 122 is formed at a temperature of about 400 degrees C. or less in some embodiments. The oxide 122 comprises silicon dioxide or other oxide materials, for example. The oxide 122 comprises a thickness of about 20 Angstroms to about 100 Angstroms. The oxide 122 may alternatively comprise other dimensions.

The oxide 122 may be formed using an atomic layer deposition (ALD) process, for example. In some embodiments, the oxide 122 is formed using a plasma-enhanced ALD (PE-ALD) process, for example. The PE-ALD process used to form the oxide 122 may comprise a temperature of about 200 degrees C. to about 400 degrees C. at a radio frequency (RF) power of about 10 Watts to about 500 Watts, for example. Alternatively, other processes, temperatures, and power levels may be used to form the oxide 122. The oxide 122 is not formed using an oxidation process for the fins; rather a deposition process is used to form the oxide 122, to avoid substantial consumption of the material of the fins 114 and 116, which would narrow a channel region of FinFET devices formed from the fins 114 and 116.

The oxide 122 comprises a substantially conformal oxide layer having a conformality of about 95% or greater in some embodiments. Advantageously, a relatively low temperature process, e.g., of less than about 400 degrees C., is used to form the oxide 122, which results in a deposition of the oxide 122 and prevents a reaction with the material of the fins 114 and/or 116, in particular the second fins 116 which comprise a compound semiconductor material or Sn in some embodiments. An oxidation of the second fins 116 (which could occur at temperatures above 400 degrees C., for example) could result in substantial consumption of the semiconductive material or Sn of the second fins 116 and may deleteriously affect the performance of the semiconductor device 100, for example.

The oxide 122 is then post-treated (e.g., after the deposition process for the oxide 122) at a relatively low temperature, e.g., at a temperature of about 600 degrees C. or less. In some embodiments, the oxide 122 is post-treated twice using a first post-treatment process and a second post-treatment process. The post-treatment process (or processes) improves the oxide 122 film quality, repairs the oxide 122 film interstitial and vacancy sites, and reconstructs atom networks, e.g., of Si—O atom networks within the oxide 122. The post-treatment process for the oxide 122 comprises a plasma treatment process, an anneal process, an ultraviolet (UV) light exposure process, and/or a combination thereof in some embodiments.

Figure 3:
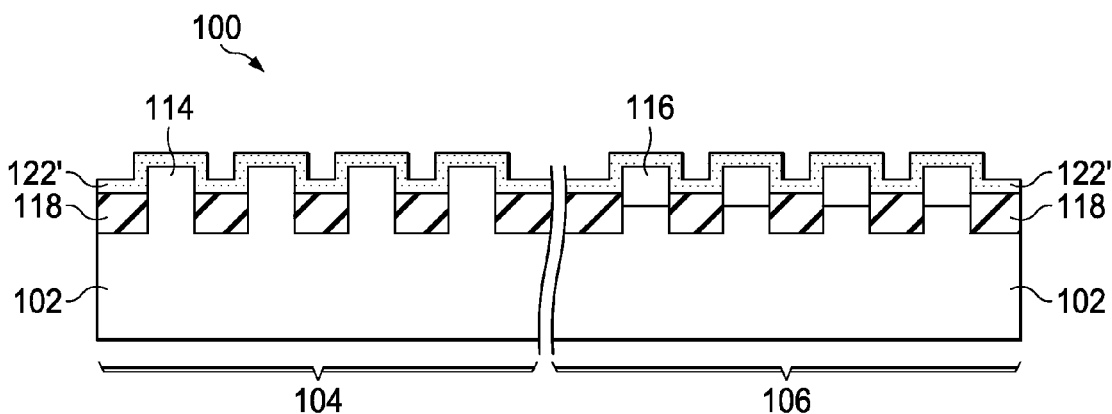

For example, in some embodiments, the oxide 122 is first post-treated using a first post-treatment process, wherein the first post-treatment process comprises an $O_2$ plasma post-treatment process. The first post-treatment process results in an improvement in the film quality of the oxide 122, forming an improved quality oxide 122', as shown in FIG. 3. The improved quality oxide 122' provides an effective protection material for the materials of the fins 114 and 116. The in-situ $O_2$ plasma treatment comprises a temperature of about 200 degrees C. to about 400 degrees C. and a power of about 200 Watts to about 500 Watts in some embodiments. Alternatively, the in-situ $O_2$ plasma treatment of the first post-treatment process may comprise other temperatures and power settings. The first post-treatment process may alternatively comprise other types of treatment processes adapted to improve the quality of the oxide film.

Figure 4:
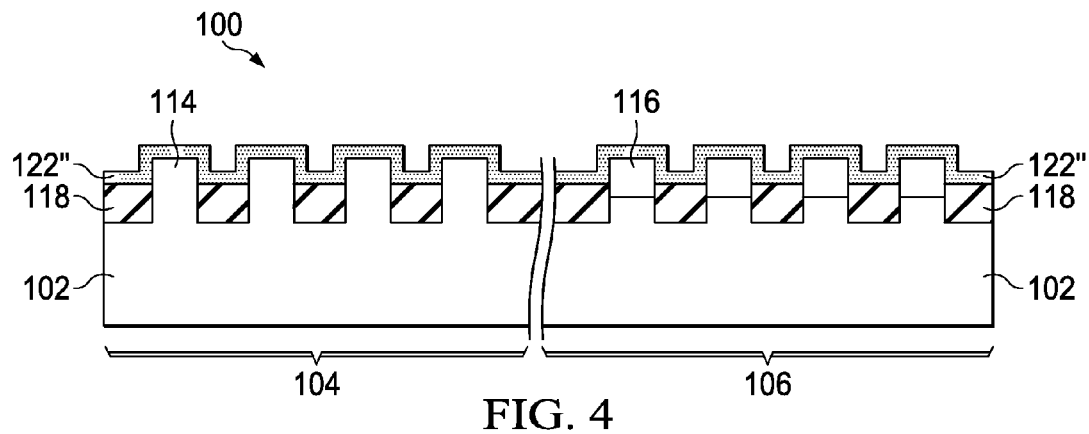

The improved quality oxide 122' is then post-treated with a second post-treatment process, wherein the second post-treatment process comprises an oxygen-containing post-treatment process, in some embodiments. The second post-treatment process further improves the oxide 122' to form a repaired oxide 122", as shown in FIG. 4. The second post-treatment process repairs the improved quality oxide 122' film interstitial and vacancy sites, and reconstruct the atom networks within the improved quality oxide 122'. The repaired oxide 122" advantageously functions as a barrier that prevents the fins 114 and 116 from oxidizing after the second post-treatment process in some embodiments, for example.

The as-deposited oxide 122, the improved quality oxide 122', and the repaired oxide 122" are all also referred to herein, e.g., in some of the claims, as an oxide.

The second post-treatment process comprises an anneal process in an $O_2$ ambient in some embodiments. The anneal process comprises a temperature of about 400 degrees C. to about 600 degrees C., for example. The anneal process is performed at a relatively high pressure in some embodiments. For example, the anneal process may be performed at a pressure of about 5 atmospheres (ATM) to about 20 ATM. Alternatively, the anneal process may comprise other temperatures and pressures.

In other embodiments, the second post-treatment process comprises a UV light treatment process in an $O_3$ ambient. The UV light treatment process comprises a temperature of about 300 degrees C. to about 450 degrees C., a pressure of about 4 Torr to about 20 Torr, and a time period of about 1 minute to about 10 minutes, as examples. Alternatively, the UV light treatment process may comprise other temperatures, pressures, and time periods or durations.

In some embodiments, performing the second post-treatment process comprises: first, an anneal process in an $O_2$ ambient; and second, a UV light treatment process in an $O_3$ ambient.

The oxide 122 formation process and post treatment processes used to form the improved quality oxide 122' and repaired oxide 122" are advantageously performed at low temperatures so that the fins 114 and 116, and particularly the second fins 116 in some embodiments, are not substantially consumed by the oxide 122". In some embodiments, no portion of the second fins 116 is consumed during the oxide 122" formation, so that the width of the second fins 116 prior to the oxide 122 deposition process remains substantially the same.

The manufacturing process for the semiconductor device 100 is then continued. For example, in FIG. 5, a gate dielectric 130 may be disposed (e.g., formed or deposited) over the oxide 122". The gate dielectric 130 is formed on sidewalls and top surfaces of the fin 114 and 116 over the oxide 122". The gate dielectric 130 may comprise a dielectric material such as silicon oxide, silicon nitride, an oxynitride, multi-layers thereof, and/or combinations thereof. The gate dielectric 130 may also comprise high dielectric constant (k) dielectric materials, for example. Some exemplary high-k materials may have k values of greater than about 4.0, or greater than about 7.0. In some embodiments, the gate dielectric 130 layer is not included.

In some embodiments, the novel oxide 122" described herein may comprise a part of a gate dielectric. For example, the oxide 122" may comprise a bottom material layer of the gate dielectric. Thus, the overall gate dielectric is comprised of the bottom oxide 122" layer and the upper gate dielectric 130 layer, in some embodiments.

The gate material 132 is formed over the gate dielectric 130, or over the oxide 122" in embodiments wherein the gate dielectric 130 layer is not included. The gate material 132 may be formed of doped polysilicon, metals, metal nitrides, metal silicides, and the like. The gate material 132 may comprise a conformal material when applied, taking on the topography of the underlying gate dielectric 130 (not shown). The gate material 132 and the gate dielectric 130 (and also the oxide 122" in some embodiments) may be patterned using a lithography process (also not shown). After the formation of the gate dielectric 130 and the gate material 132, source and drain regions (not in the illustrated plane shown in FIG. 5) of the FinFETs 140 and 140' may be formed to complete the manufacturing process for the semiconductor device 100. The fins 114 and 116 comprise channels of the FinFETs 140 and 140', respectively, in some embodiments.

Figure 5:
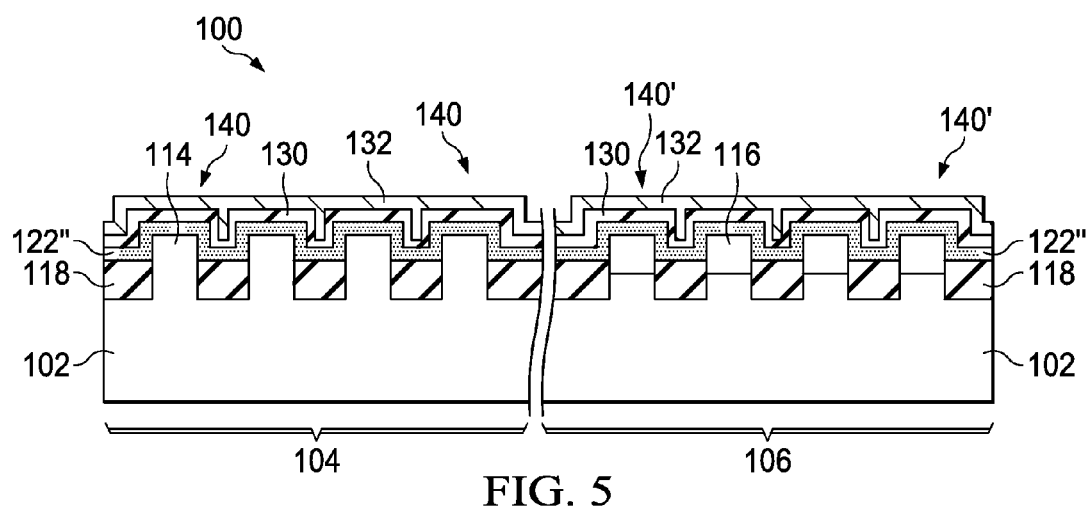

In some embodiments, for example, in embodiments wherein the gate material 132 comprises polysilicon, the gate dielectric 130 layer is not included, and the oxide 122" comprises the only material layer of the gate dielectric. Thus, additional material layer described herein as a gate dielectric 130 shown in FIG. 5 is not included in these embodiments, and the oxide 122" functions as the gate dielectric of the FinFETs 140 and 140'.

The semiconductor device 100 comprises a plurality of FinFET devices 140 and 140'. FinFET devices 140 are disposed in the first region 104 and are formed from the first fins 114. FinFET devices 140 comprise input/output devices in some embodiments, for example. The input/output devices may be coupled to wiring in conductive layers of the semiconductor device 100 that is coupled to contacts proximate an exterior (e.g., a surface) of the semiconductor device 100, so that electrical contact may be made to the FinFET devices 140, for accessing, selecting, controlling, and other actions related to FinFET devices 140' that comprise core devices in some embodiments. FinFET devices 140' are disposed in the second region 106 and are formed from the second fins 116. FinFET devices 140' comprise core devices, for example. The core devices may be adapted to perform predetermined functions of the semiconductor device 100, such as logic, processing, memory, or other functions, for example.

Figure 6:
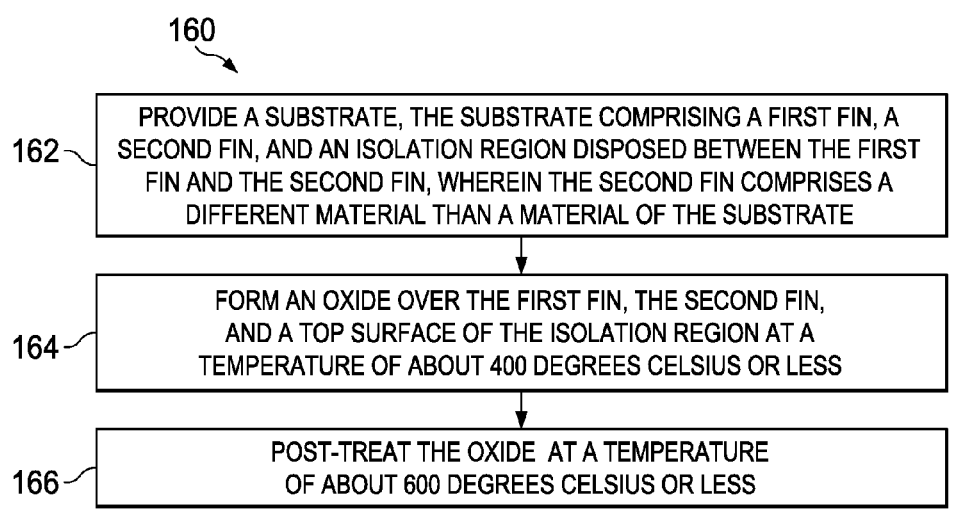
FIG. 6 is a flow chart of a method of manufacturing a semiconductor device in accordance with some embodiments.

FIG. 6 is a flow chart 160 of a method of manufacturing a semiconductor device 100 (see also FIGS. 1 through 5) in accordance with some embodiments. In step 162, a substrate 102 is provided, the substrate 102 comprising a first fin 114, a second fin 116, and an isolation region 118 disposed between the first fin 114 and the second fin 116 (FIG. 1). The second fin 116 comprises a different material than a material of the substrate 102. In step 164, an oxide 122 is formed over the first fin 114, the second fin 116, and a top surface of the isolation region 118 at a temperature of about 400 degrees C. or less (FIG. 2). In step 166, the oxide 122 is post-treated at a temperature of about 600 degrees C. or less (FIGS. 3 and 4), forming oxide 122".

Embodiments of the present disclosure include methods of manufacturing semiconductor devices 100, and also include semiconductor devices 100 that have been manufactured using the methods described herein. Embodiments of the present disclosure include methods of manufacturing FinFETs 140 and 140', and also include FinFETs 140 and 140' that have been manufactured using the methods described herein.

The semiconductor devices 100 may comprise complementary metal oxide semiconductor (CMOS) FinFETs 140 and 140' in some embodiments. Embodiments of the present disclosure are implementable in FinFETs comprising n channel FETs (NFETs) and/or p channel FETs (PFETs), for example.

Advantages of some embodiments of the present disclosure include providing a novel oxide 122" formation processes for semiconductor devices 100 and FinFETs 140 and 140'. The oxide 122" comprises a novel input/output gate oxide and core gate oxide formed by low temperature processes for FinFET devices. The low temperature processes protect the second fins 116 in particular from oxidation during the formation of the oxide 122". The oxide 122" functions as a protection layer for the second fins 116 during the oxide 122" formation and after the formation of the oxide 122".

A high temperature oxide growth process such as in-situ steam generation (ISSG) and subsequent annealing, which require temperatures of up to about 900 degrees C. or greater, are advantageously not required to form the novel oxide 122" described herein. Thus, channel strain is reduced, channel width is maintained, and improved reliability performance of the FinFETs is achieved. In embodiments wherein the fins in the core device region comprise SiGe, conversion of the fins to SiGeO (which could occur if ISSG were to be used) is avoided, by implementing the novel low temperature oxide deposition and post-treatment methods described herein.

Some embodiments of the present disclosure are particularly advantageous when used with FinFET devices comprising SiGe fins, which are used in high mobility devices in core device regions in some applications, for example. The low temperatures used to form the oxide prevent the SiGe fins from re-flowing and from oxidizing, and also sustain SiGe channel strain. Furthermore, the low temperature oxide formed does not comprise SiGeO, because the SiGe fin material is not consumed during the formation of the oxide. Depositing the oxide using a low RF power of about 500 Watts or less reduces plasma damage from the PE-ALD deposition process on the SiGe fins. A subsequent post-treatment process using a higher RF power (e.g., higher than the deposition power) is used to improve the oxide quality, which advantageously can be performed using the same PE-ALD tool that was used to deposit the oxide. The post-treatment process or processes may comprise a high pressure oxide (HPO) formation process in some embodiments, for example.

Comparable reliability performance of FinFET devices in core device regions with reliability performance of FinFET devices in I/O device regions is achievable using the novel methods of forming and post-treating the oxide described herein. The oxide formed over the FinFET fins has comparable quality to oxides formed using ISSG. The oxide formation and post-treatment methods advantageously have low or no substrate (i.e., fin) consumption. Furthermore, the methods described herein are easily implementable in semiconductor device and FinFET manufacturing process flows.

In some embodiments, a method of manufacturing a semiconductor device includes providing a substrate, the substrate includes a first fin, a second fin, and an isolation region disposed between the first fin and the second fin. The second fin includes a different material than a material of the substrate. The method includes forming an oxide over the first fin, the second fin, and a top surface of the isolation region at a temperature of about 400 degrees C. or less, and post-treating the oxide at a temperature of about 600 degrees C. or less.

In other embodiments, a method of manufacturing a semiconductor device includes forming a plurality of first fins over a substrate, the plurality of first fins comprising a same material as a material of the substrate, and forming a plurality of second fins over the substrate, the plurality of second fins comprising a different material than the material of the substrate. A plurality of STI regions are formed between the plurality of first fins and the plurality of second fins, wherein top surfaces of the plurality of STI regions are recessed below top surfaces of the plurality of first fins and the plurality of second fins. An oxide is formed over the plurality of first fins, the plurality of second fins, and the top surfaces of the plurality of STI regions using an ALD process. The method includes performing a first post-treatment process, the first post-treatment process comprising an $O_2$ plasma post-treatment process, and performing a second post-treatment process, the second post-treatment process comprising an oxygen-containing post-treatment process.

In other embodiments, a semiconductor device includes a plurality of first fins disposed over a substrate, the substrate comprising a semiconductive material, the plurality of first fins comprising the semiconductive material. The semiconductor device includes a plurality of second fins disposed over the substrate, the plurality of second fins comprising a compound semiconductive material or Sn. A plurality of STI regions is disposed between the plurality of first fins and the plurality of second fins, wherein top surfaces of the plurality of STI regions are recessed below top surfaces of the plurality of first fins and the plurality of second fins. The semiconductor device includes an oxide disposed over the plurality of first fins, the plurality of second fins, and the top surfaces of the plurality of STI regions. The plurality of second fins is not substantially consumed by the oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a fin field effect transistor (FinFET) semiconductor device, the method comprising:

forming a first fin and a second fin on a substrate, the first fin comprising a same material as the material of the substrate;

masking the first fin while a substance is introduced to alter a material of the second fin, the altered material of the second fin being a layer of different material than the material of the substrate;

after the forming the first fin and the second fin, forming an isolation region between the first fin and the second fin;

forming a $SiO_2$ layer over the first fin, the second fin, and a top surface of the isolation region using a plasma-enhanced atomic layer deposition (PE-ALD) process at a power of from about 10 Watts to about 500 Watts and at a temperature of from about 200 degrees C. to about 400 degrees C.;

after forming the $SiO_2$ layer, post-treating the $SiO_2$ layer with an in-situ O2 plasma treatment at a temperature of about 600 degrees C. or less; and after post-treating the $SiO_2$ layer, performing an anneal process, the annealed $SiO_2$ layer forming a gate dielectric of the FinFET semiconductor device.

2. The method according to claim 1, wherein providing the substrate comprises the first fin comprising a same material as the material of the substrate.

3. The method according to claim 2, wherein the material of the substrate comprises Si or Ge, or wherein the layer of different material comprises SiGe, SiC, or Sn.

4. The method according to claim 1, wherein forming the $SiO_2$ layer comprises forming a substantially conformal layer having a conformality of about 95% or greater.

5. The method according to claim 1, wherein the in-situ $O_2$ plasma treatment comprises a power of about 200 Watts to about 500 Watts.

6. The method according to claim 1, wherein the anneal process comprises at least one of an ultraviolet (UV) light exposure processor a high pressure oxidation process.

7. A method of manufacturing a semiconductor device, the method comprising:
    forming a fin field effect transistor (FinFET) device comprising:
        forming a plurality of first fins over a substrate, the plurality of first fins comprising a same material as a material of the substrate;
        forming a plurality of second fins over the substrate, the plurality of second fins comprising a different material than the material of the substrate;
        forming a plurality of shallow trench isolation (STI) regions between the plurality of first fins and the plurality of second fins, wherein top surfaces of the plurality of STI regions are recessed below top surfaces of the plurality of first fins and the plurality of second fins, the plurality of STI regions comprising a first material layer;
        forming an oxide over the plurality of first fins, the plurality of second fins, and the top surfaces of the plurality of STI regions using an atomic layer deposition (ALD) process, wherein material of the oxide comprises a second material layer that is different than the first material layer;
        after forming the oxide, performing a first post-treatment process, the first post-treatment process comprising an ultraviolet (UV) light treatment process in ambient $O_3$, wherein the UV light treatment process is performed at a temperature of from about 300 degrees C. to about 450 degrees C., at a pressure of from about 4 Torr to about 20 Torr, or for a time period of from about 1 minute to about 10 minutes; and
        after the first post-treatment process, performing a second post-treatment process, the second post-treatment process comprising an oxygen-containing post-treatment process, the second post-treatment process different than the first post-treatment process.

8. The method according to claim 7, wherein forming the oxide comprises using a plasma-enhanced ALD (PE-ALD) process.

9. The method according to claim 7, wherein performing the second post-treatment process comprises an anneal process in ambient $O_2$.

10. The method according to claim 9, wherein the anneal process comprises a temperature of about 400 degrees C. to about 600 degrees C. or a pressure of about 5 atmospheres (ATM) to about 20 ATM.

11. A method of manufacturing a fin field effect (FinFET) semiconductor device, comprising:
    patterning isolation regions over a substrate with a pattern for a first fin and a second fin;
    forming the first fin by epitaxially growing the first fin in a first region of the substrate within the pattern formed in the isolation regions;
    forming the second fin by epitaxially growing the second fin in a second region of the substrate within the pattern formed in the isolation regions, the second fin comprising a material different from a material of the substrate;
    depositing an oxide layer over the first fin and the second fin at a temperature of about 200 degrees C. to about 400 degrees C., the oxide layer deposited with an atomic layer deposition (ALD) process;
    first treating the oxide layer using an $O_2$ plasma treatment to form a first treated oxide layer;
    second treating the first treated oxide layer to form a second treated oxide layer having an improved quality oxide relative the first treated oxide layer, wherein the second treating comprises performing a ultraviolet (UV) light treatment process in ambient $O_3$ at a temperature of about 300 degrees C. to about 450 degrees C., at a pressure of from about 4 Torr to about 20 Torr, and for a time period of from about 1 minute to about 10 minutes;
    disposing a gate dielectric layer over the second treated oxide layer; and
    disposing a gate material over the gate dielectric layer of the FinFET semiconductor device.

12. The method according to claim 11, wherein second treating comprises an anneal process in an $O_2$ ambient environment at a temperature less than about 600 degrees C.

13. The method according to claim 11, wherein forming the first fin and forming the second fin comprises: etching the substrate to form the first fin and the second fin; masking the first fin; and introducing a substance to alter the material of the second fin to form the material different from the material of the substrate.

14. The method according to claim 1, wherein the in-situ O2 plasma treatment comprises a temperature of about 200 degree C. to about 400 degrees C.

15. The method according to claim 1, wherein a width of the second fin after post-treating the $SiO_2$ layer is the same as the width of the second fin before post-treating the $SiO_2$ layer.

16. The method according to claim 1, wherein the altered material of the second fin comprises SiGe, and wherein the SiO$_2$ layer is free of SiGe.

17. The method according to claim 7, wherein widths of the second fins after performing a second post-treatment process is the same as the widths of the second fins before performing a second post-treatment process.

18. The method according to claim 7, further comprising: depositing a gate dielectric over the oxide; and depositing a gate material over the gate dielectric.

19. The method according to claim 7, wherein performing the second post-treatment process further comprises: an anneal process in ambient O$_2$.

20. The method according to claim 11, wherein a width of the second fin after the second treating the first treated oxide layer is the same as the width of the second fin before the second treating the first treated oxide layer.

* * * * *